United States Patent
Kim et al.

(10) Patent No.: US 7,202,521 B2
(45) Date of Patent: Apr. 10, 2007

(54) SILICON-OXIDE-NITRIDE-OXIDE-SILICON (SONOS) MEMORY DEVICE AND METHODS OF MANUFACTURING AND OPERATING THE SAME

(75) Inventors: Moon-kyung Kim, Yongin-si (KR); Chung-woo Kim, Seongnam-si (KR); Jo-won Lee, Suwon-si (KR); Eun-hong Lee, Anyang-si (KR); Hee-soon Chae, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 10/961,481

(22) Filed: Oct. 12, 2004

(65) Prior Publication Data

US 2005/0112815 A1  May 26, 2005

(30) Foreign Application Priority Data

Oct. 10, 2003  (KR) ............... 10-2003-0070643

(51) Int. Cl.
*H01L 29/76* (2006.01)

(52) U.S. Cl. ............ 257/314; 257/315; 438/201; 438/211; 438/257

(58) Field of Classification Search ........ 257/314, 257/315, E21.422, E29.17
See application file for complete search history.

(56) References Cited

U.S. PATENT DOCUMENTS

| | | | | |
|---|---|---|---|---|
| 5,120,666 A | * | 6/1992 | Gotou | 438/164 |
| 5,646,058 A | * | 7/1997 | Taur et al. | 438/283 |
| 5,841,693 A | * | 11/1998 | Tsukiji | 365/185.01 |
| 5,929,479 A | * | 7/1999 | Oyama | 257/315 |
| 6,054,734 A | * | 4/2000 | Aozasa et al. | 257/315 |
| 6,365,465 B1 | * | 4/2002 | Chan et al. | 438/283 |
| 6,538,292 B2 | * | 3/2003 | Chang et al. | 257/391 |
| 6,686,630 B2 | * | 2/2004 | Hanafi et al. | 257/366 |
| 6,687,152 B2 | * | 2/2004 | Ohsawa | 365/149 |
| 6,753,572 B2 | * | 6/2004 | Lee et al. | 257/324 |
| 6,759,282 B2 | * | 7/2004 | Campbell et al. | 438/149 |
| 6,831,310 B1 | * | 12/2004 | Mathew et al. | 257/270 |
| 6,921,700 B2 | * | 7/2005 | Orlowski et al. | 438/283 |
| 6,943,404 B2 | * | 9/2005 | Huang et al. | 257/324 |

* cited by examiner

*Primary Examiner*—Eugene Lee
(74) *Attorney, Agent, or Firm*—Lee & Morse, P.C.

(57) ABSTRACT

In a silicon-oxide-nitride-oxide-silicon (SONOS) memory device, and methods of manufacturing and operating the same, the SONOS memory device includes a semiconductor layer including source and drain regions and a channel region, an upper stack structure formed on the semiconductor layer, the upper stack structure and the semiconductor layer forming an upper SONOS memory device, and a lower stack structure formed under the semiconductor layer, the lower stack structure and the semiconductor layer forming a lower SONOS memory device.

31 Claims, 5 Drawing Sheets

SILICON-OXIDE-NITRIDE-OXIDE-SILICON (SONOS) MEMORY DEVICE AND METHODS OF MANUFACTURING AND OPERATING THE SAME

BACKGROUND OF THE INVENTION

1. Field of the Invention

The present invention relates to a semiconductor memory device and methods of manufacturing and operating the same. More particularly, the present invention relates to a silicon-oxide-nitride-oxide-silicon (SONOS) memory device and methods of manufacturing and operating the same.

2. Description of the Related Art

A unit cell of a semiconductor memory device, such as a dynamic random access memory (DRAM), includes a single transistor and a single capacitor. In order to increase a packing density of a semiconductor memory cell, a volume of a transistor and/or a capacitor should be reduced. In the early stages of semiconductor memory devices, photolithography provided a sufficient margin that allowed the packing density of semiconductor memory devices to be increased just by decreasing the volumes of respective elements. Presently, however, if the packing density of semiconductor memory devices is to be further increased, a new method is required.

The packing density of semiconductor memory devices is also closely related to design rules. Accordingly, design rules may be narrowed in order to increase the packing density of the semiconductor memory devices. In this case, photolithography and etching process margins may be significantly lowered. Here, lowered process margins mean that a photolithography process should be performed more precisely. If a photolithography process margin is lowered, yield may be excessively decreased. Therefore, a new method capable of increasing the packing density of semiconductor devices and increasing the yield is required.

To meet this demand, semiconductor memory devices having quite atypical structures, in which a data storage medium, e.g., giant magnetoresistance (GMR) or tunneling magnetoresistance (TMR) having a data storage operation different from that of a well-known capacitor, is provided over the upper side of a transistor, have been introduced.

Recently, a SONOS memory device has been introduced as a semiconductor memory device in an attempt to meet these requirements. FIG. 1 illustrates a cross-sectional view of a conventional SONOS memory device (hereinafter referred to as a conventional memory device).

Referring to FIG. 1, a source region 12 and a drain region 14 are formed by implanting n-type impurities into a p-type semiconductor substrate 10 (hereinafter referred to as a semiconductor substrate). A channel region 16 is defined between the source and drain regions 12 and 14. A gate stack structure 18 is formed on the channel region 16 of the semiconductor substrate 10. The gate stack structure 18 is formed of a tunneling oxide layer 18a, a silicon nitride ($Si_3N_4$) layer 18b, a barrier oxide layer 18c, and a gate electrode 18d. The tunneling oxide layer 18a contacts the source and drain regions 12 and 14. The silicon nitride layer 18b has a trap site of a predetermined density. Accordingly, when the gate electrode 18d is supplied with a predetermined voltage, electrons pass through the tunneling oxide layer 18a and are trapped in the trap site of the silicon nitride layer 18b. The barrier oxide layer 18c blocks migration of the electrons toward the gate electrode 18d during the charge trapping.

In the conventional memory device, a threshold voltage varies according to whether electrons are trapped at the trap site of the silicon nitride layer 18b. Using this characteristic, information can be stored in and read out from the conventional memory device.

Because the electron trap site is within the silicon nitride layer in the conventional memory device, sufficient electrons to control a threshold voltage of a channel can be stored. However, only one bit of information can be stored in a single unit cell.

Thus, in the case of the conventional memory device, the volume of the memory device has to be decreased in order to increase the packing density. However, as design rules narrow, there is a limit to increasing the packing density merely by decreasing the volume of the memory device.

SUMMARY OF THE INVENTION

The present invention is therefore directed to a SONOS memory device and methods of manufacturing and operating the same, which substantially overcome one or more of the problems due to the limitations and disadvantages of the related art.

It is a feature of an embodiment of the present invention to provide a SONOS memory device, and methods of manufacturing and operating the same, that can be manufactured with a high packing density without narrowing design rules.

It is another feature of an embodiment of the present invention to provide a SONOS memory device, and methods of manufacturing and operating the same, in which a packing density can be significantly increased while applying conventional design rules.

It is still another feature of an embodiment of the present invention to provide a SONOS memory device, and methods of manufacturing and operating the same, that can be easily manufactured using only conventional CMOS processing.

At least one of the above and other features and advantages of the present invention may be realized by providing a SONOS memory device including a semiconductor layer including source and drain regions and a channel region, an upper stack structure formed on the semiconductor layer, the upper stack structure and the semiconductor layer forming an upper SONOS memory device, and a lower stack structure formed under the semiconductor layer, the lower stack structure and the semiconductor layer forming a lower SONOS memory device.

The upper stack structure may include an upper tunneling layer, an upper memory node layer, an upper insulating layer, and an upper gate electrode, which are sequentially stacked on the channel region of the semiconductor layer. The lower stack structure may include a lower tunneling layer, a lower memory node layer, a lower insulating layer, and a lower gate electrode, which are sequentially stacked under the channel region of the semiconductor layer.

The upper memory node layer may be formed of a nitride layer or PZT layer having a predetermined trap density. The upper insulating layer may be formed of one selected from the group consisting of an $SiO_2$ layer, an $Al_2O_3$ layer, a $TaO_2$ layer, and a $TiO_2$ layer.

The lower memory node layer may be formed of a nitride layer or a PZT layer having a predetermined trap density. The lower insulating layer may be formed of one selected from the group consisting of an $SiO_2$ layer, an $Al_2O_3$ layer, a $TaO_2$ layer, and a $TiO_2$ layer.

The upper and lower memory node layers may have different thicknesses. The upper and lower memory node layers may have different trap densities. The upper and lower memory node layers may be formed of different materials. The upper and lower tunneling layers may have different thicknesses.

At least one of the above and other features and advantages of the present invention may be realized by providing a method of manufacturing a silicon-oxide-nitride-oxide-silicon (SONOS) memory device including forming a lower stack structure on a first semiconductor substrate, the lower stack structure sequentially including a lower insulating layer, a lower memory node layer, and a lower tunneling layer, forming a semiconductor layer on the lower tunneling layer, the lower stack structure and the semiconductor layer forming a lower SONOS memory device, forming an upper stack structure on a predetermined region of the semiconductor layer, the upper stack structure and the semiconductor layer forming an upper SONOS memory device, and forming source and drain regions and a channel region in the semiconductor layer.

Forming the source and drain regions and the channel region in the semiconductor layer may be performed before forming the upper stack structure, and forming the source and drain regions and the channel region may include forming a photoresist layer pattern that defines the channel region on the semiconductor layer, implanting a conductive impurity into the semiconductor layer to form the source and drain regions and the channel region in the semiconductor layer, and removing the photoresist layer pattern.

Forming the semiconductor layer on the lower tunneling layer may include forming a hydrogen ion layer within a second semiconductor substrate, bonding a surface of the second semiconductor substrate to the lower tunneling layer, and removing a portion of the second semiconductor substrate on an opposite side of the hydrogen ion layer as the bonded surface of the second semiconductor substrate.

In the method, before forming the source and drain regions and the channel region in the semiconductor layer, forming the upper stack structure on the predetermined region of the semiconductor layer may include sequentially forming an upper tunneling layer, an upper memory node layer, an upper insulating layer, and a material layer for a gate electrode on the semiconductor layer, forming a photoresist layer pattern that defines the channel region on the material layer, etching the layers stacked on the semiconductor layer in the opposite order to the order in which they were formed, using the photoresist layer pattern defining the channel region as an etch mask, and removing the photoresist layer pattern, after forming the source and drain regions and the channel region in the semiconductor layer.

At least one of the above and other features and advantages of the present invention may be realized by providing a method of operating a silicon-oxide-nitride-oxide-silicon (SONOS) memory device including a semiconductor layer having source and drain regions and a channel region, an upper stack structure disposed on the semiconductor layer, the upper stack structure and the semiconductor layer forming an upper SONOS memory device, and a lower stack structure disposed under the semiconductor layer, the lower stack structure and the semiconductor layer forming a lower SONOS memory device, the method including applying a first write voltage between the semiconductor layer and the lower SONOS memory device to write a first data to the lower SONOS memory device. The method may further include applying a second write voltage between the semiconductor layer and the upper SONOS memory device to write a second data to the upper SONOS memory device, after writing the first data to the lower SONOS memory device.

At least one of the above and other features and advantages of the present invention may be realized by providing a method of operating a silicon-oxide-nitride-oxide-silicon (SONOS) memory device including a semiconductor layer having source and drain regions and a channel region, an upper stack structure disposed on the semiconductor layer, the upper stack structure and the semiconductor layer forming an upper SONOS memory device, and a lower stack structure disposed under the semiconductor layer, the lower stack structure and the semiconductor layer forming a lower SONOS memory device, the method including applying a read voltage to either the upper or lower SONOS memory device while maintaining a potential difference between the source and drain regions to read out data stored in the upper or lower SONOS memory devices, respectively.

At least one of the above and other features and advantages of the present invention may be realized by providing a method of operating a silicon-oxide-nitride-oxide-silicon (SONOS) memory device including a semiconductor layer having source and drain regions and a channel region, an upper stack structure disposed on the semiconductor layer, the upper stack structure and the semiconductor layer forming an upper SONOS memory device, and a lower stack structure disposed under the semiconductor layer, the lower stack structure and the semiconductor layer forming a lower SONOS memory device, the method including applying a first erase voltage between the semiconductor layer and the upper SONOS memory device to erase data written to the upper SONOS memory device. The method may further include applying a second erase voltage between the semiconductor layer and the lower SONOS memory device to erase data written to the lower SONOS memory device.

The first erase voltage may have a polarity opposite to a polarity of a first write voltage used to write data to the upper SONOS memory device. The second erase voltage may have a polarity opposite to a polarity of a second write voltage used to write data to the lower SONOS memory device.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
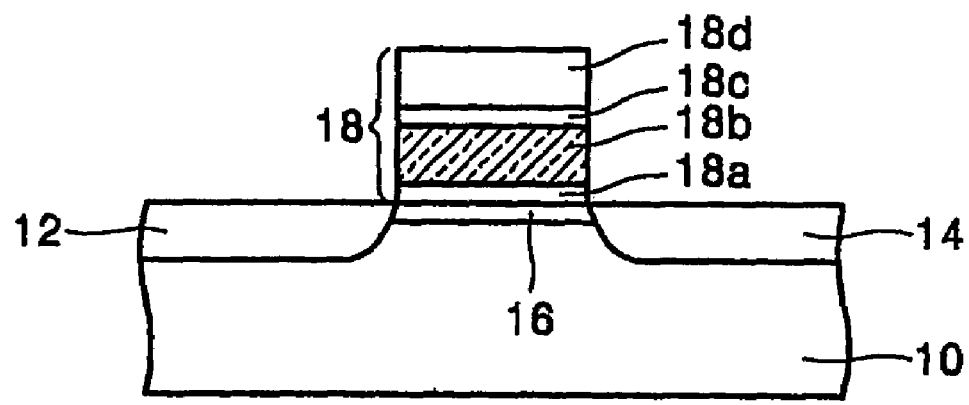
FIG. 1 illustrates a cross-sectional view of a conventional SONOS memory device.

Korean Patent Application No. 2003-70643, filed on Oct. 10, 2003, in the Korean Intellectual Property Office, and entitled: "SONOS Memory Device and Methods of Manufacturing and Operating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters refer to like elements throughout.

Figure 2:
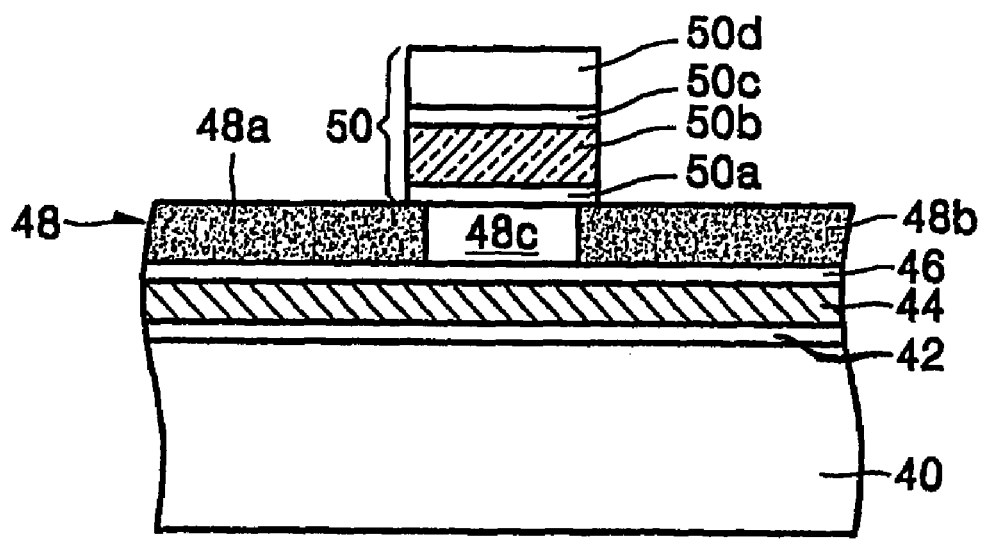
FIG. 2 illustrates a cross-sectional view of a SONOS memory device according to an embodiment of the present invention.

FIG. 2 illustrates a cross-sectional view of a SONOS memory device (hereinafter referred to as a memory device) according to an embodiment of the present invention.

Referring to FIG. 2, a lower insulating layer 42, a lower memory node layer 44, and a lower tunneling layer 46 are sequentially stacked on a semiconductor substrate 40, e.g., an n$^+$ silicon substrate. The lower insulating layer 42 prevents carriers, e.g., electrons, from migrating to the semiconductor substrate 40 while the carriers are being trapped. The lower insulating layer 42 is preferably formed of a silicon oxide ($SiO_2$) layer, but may also be one of an aluminum oxide ($Al_2O_3$) layer, a tantalum oxide ($TaO_2$) layer, a titanium oxide ($TiO_2$) layer, and the like. The lower tunneling layer 46 is preferably formed of a silicon oxide layer, but may be another insulating layer. The lower memory node layer 44 may be an insulating layer, e.g., a nitride layer or a PZT layer, that has a predetermined trap density, e.g., about $10^{12}/cm^2$ or more, that is capable of trapping the carriers. A first semiconductor layer 48 is disposed on the lower tunneling layer 46. The first semiconductor layer 48 includes source and drain regions 48a and 48b doped with an n$^+$ conductive impurity, and a channel region 48c between the source and drain regions 48a and 48b. A lower stack structure includes the semiconductor substrate 40, the lower insulating layer 42, the lower memory node layer 44 and the lower tunneling layer 46. The lower stack structure and the first semiconductor layer 48 form a lower SONOS memory device. Because the first semiconductor layer 48 is also used to form an upper SONOS memory device, which will be described later, the source and drain regions 48a and 48b, and the channel region 48c of the first semiconductor layer 48 are common source and drain regions and a common channel region, respectively, of the upper and lower SONOS memory devices.

An upper stack structure 50, i.e., a gate stack structure, which covers the channel region 48c and contacts the source and drain regions 48a and 48b, is formed on the first semiconductor layer 48. The upper stack structure 50 includes an upper tunneling layer 50a, an upper memory node layer 50b, an upper insulating layer 50c, and a gate electrode 50d. The upper stack structure 50 and the first semiconductor layer 48 form the upper SONOS memory device. The upper tunneling layer 50a, which is preferably formed of a silicon oxide layer, may be another insulating layer. The upper memory node layer 50b may be an insulating layer, e.g., a nitride layer or a PZT layer, that has a predetermined trap density, e.g., about $10^{12}/cm^2$ or more, that is capable of trapping carriers. The upper insulating layer 50c blocks the migration of carriers toward the gate electrode 50d when the carriers (electrons or holes) are trapped in the upper memory node layer 50b. The upper insulating layer 50c is preferably formed of an $SiO_2$ layer, but may also be one of an $Al_2O_3$ layer, a $TaO_2$ layer, and a $TiO_2$ layer. The gate electrode 50d may be either a semiconductor material doped with a conductive impurity or a metal.

Since the first semiconductor layer 48 is positioned between the gate electrode 50d and the semiconductor substrate 40, the gate electrode 50d can be considered to be an upper gate electrode and the semiconductor substrate 40 can be considered to be a lower gate electrode.

The SONOS memory device according to an embodiment of the present invention as described above has the upper and lower SONOS memory devices on and under the first semiconductor layer 48, respectively. The upper and lower SONOS memory devices store conjugate information. That is, if data "1" is stored in the upper memory device, data "0" is stored in the lower memory device, and vice versa.

Because the threshold voltages of the upper and lower SONOS memory devices are shifted oppositely when the data is stored, different information can be stored in the upper and lower SONOS memory devices.

In order to differ a threshold voltage shift in the upper and lower SONOS memory devices, the upper memory node layer 50b of the upper SONOS memory device preferably has a different trap density from that of the lower memory node layer 44 of the lower SONOS memory device. In this case, the two memory node layers 50b and 44 may have equal thicknesses. Alternatively, the upper and lower memory node layers 50b and 44 may have equal trap densities and different thicknesses.

The threshold voltage shift of the upper and lower SONOS memory devices may be varied when thicknesses of the tunneling oxide layers of the respective SONOS memory devices are different from each other.

First and second embodiments of a method of manufacturing the SONOS memory device shown in FIG. 2 will now be described with reference to FIGS. 3 through 10.

First Embodiment

Figure 3:
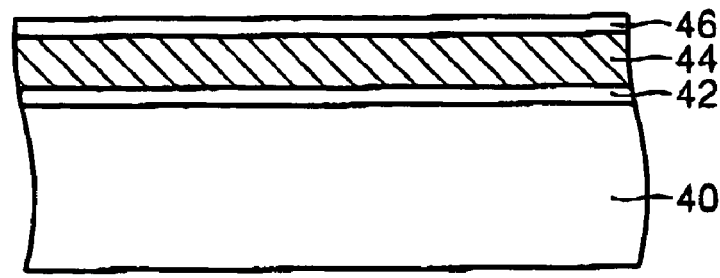
FIGS. 3 through 8 illustrate cross-sectional views of stages in a method of manufacturing the SONOS memory device shown in FIG. 2 according to a first embodiment of the present invention.

Referring to FIG. 3, the lower insulating layer 42, the lower memory node layer 44, and the lower tunneling layer 46 are sequentially formed on the semiconductor substrate 40. The lower insulating layer 42 may be formed of one of an $SiO_2$ layer, an $Al_2O_3$ layer, a $TaO_2$ layer, and a $TiO_2$ layer. The lower tunneling layer 46 is formed of a $SiO_2$ layer, but may alternatively be formed of another insulating layer. The lower memory node layer 44 may be formed of a material layer such as a nitride layer or a PZT layer with a trap density of about $10^{12}/cm^2$. The trap density of the lower memory node layer 44 may be equal to or different from that of the upper memory node layer, which will be described later.

When the trap density of the lower memory node layer 44 is different from that of the upper memory node layer, it is preferable to make the thickness of the lower memory node layer 44 different from that of the upper memory node layer. When the lower memory node layer 44 and the upper memory node layer are formed of different materials, the trap densities of the two memory node layers will likely differ from each other, regardless of whether the lower memory node layer 44 and the upper memory node layer have equal thicknesses.

Figure 4:
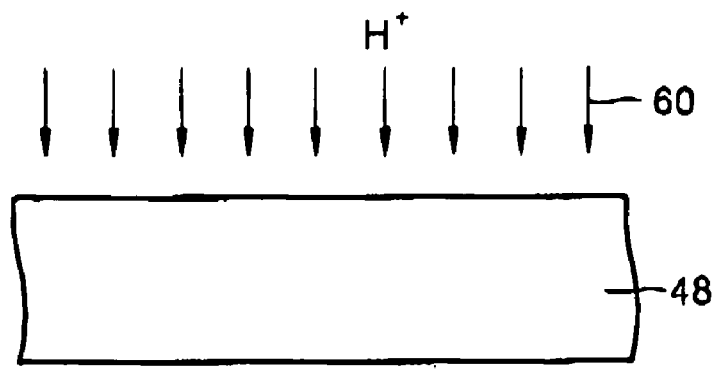

Referring to FIG. 4, the first semiconductor layer 48 is prepared and then doped with hydrogen ions 60. Because hydrogen ions 60 are implanted for dividing the first semiconductor layer 48 into two parts, a hydrogen ion layer 62, as shown in FIG. 5, is formed at a place where it is desired to separate the first semiconductor layer 48, by implanting hydrogen ions 60 at a constant energy.

Figure 5:
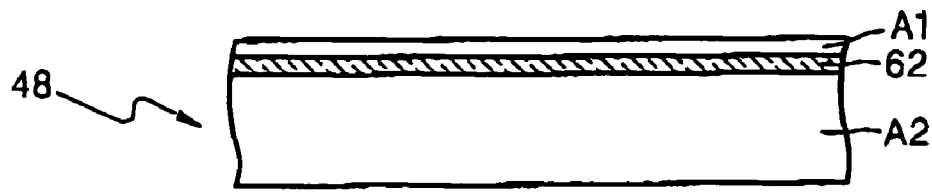

Referring to FIG. 5, one side A1 of the first semiconductor layer 48 is relatively thin and the other side A2 thereof is relatively thick, with the hydrogen ion layer 62 between the two sides. The thick side A2 will be removed in a subsequent process.

The implantation of the hydrogen ions 60, performed as shown in FIG. 4, may be performed after bonding the first semiconductor layer 48 to the lower tunneling layer 46.

Figure 6:
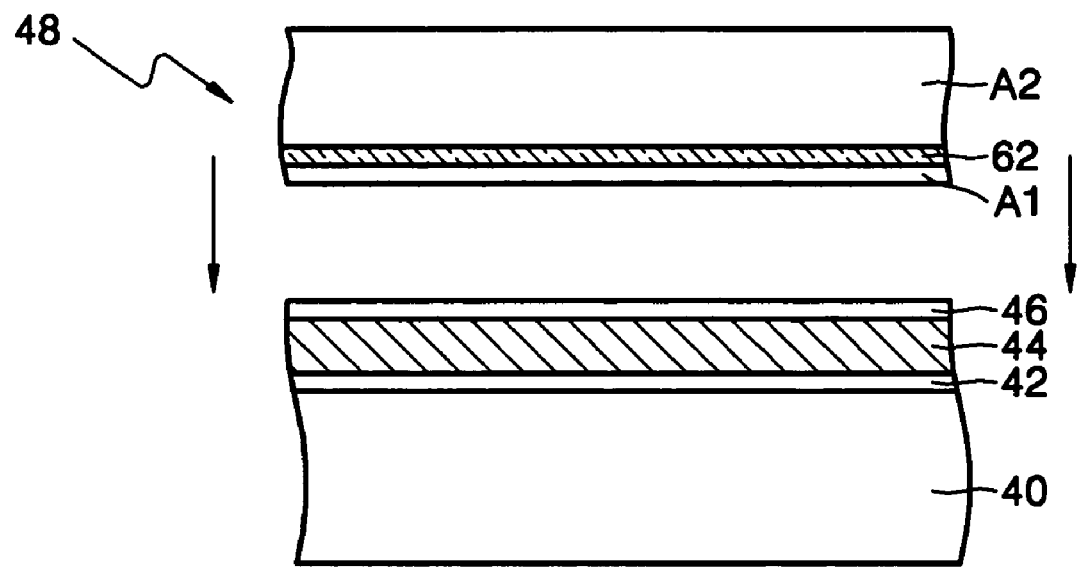

After forming the hydrogen ion layer 62 on the first semiconductor layer 48, the first semiconductor layer 48 is bonded to the semiconductor substrate 40, as shown in FIG. 6. At this time, a front side of the first semiconductor layer 48, i.e., the thinner side A1, faces toward the lower tunneling layer 46. Bonding of the first semiconductor layer 48 and the semiconductor substrate 40 is performed by compression (shown by the arrows in FIG. 6). The resultant structure obtained after performing the compression bonding may be annealed.

After the first semiconductor layer 48 is bonded to the semiconductor substrate 40, a slight force or impact is applied to the first semiconductor layer 48 to remove the thicker portion A2 of the first semiconductor layer 48. By applying this force, the thicker portion A2 of the first semiconductor layer 48 is separated from the remaining first semiconductor layer including the hydrogen ion layer 62 and the thinner portion A1. After undergoing the separation, only the thinner portion A1 of the first semiconductor layer 48 remains on the lower tunneling layer 46. Henceforth, the thinner portion A1 of the first semiconductor layer 48 remaining on the lower tunneling layer 46 will be referred to as the first semiconductor layer 48.

Figure 7:
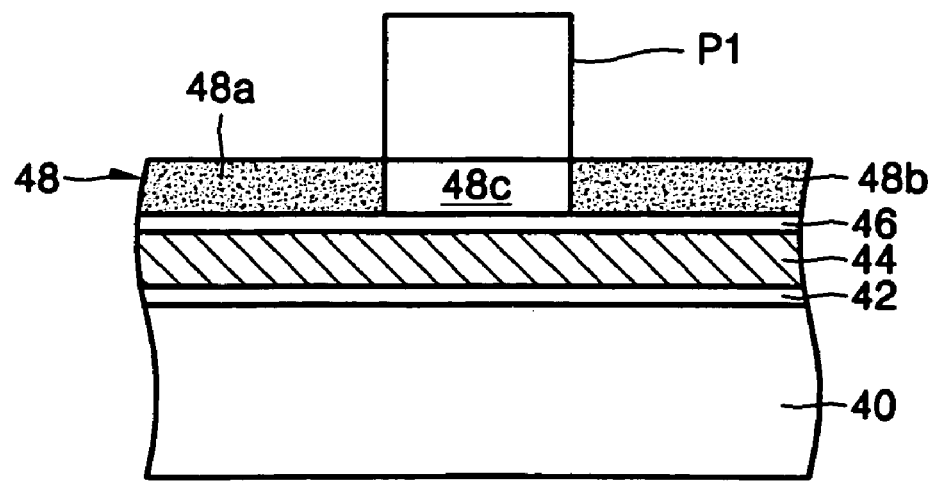

Referring to FIG. 7, a first photoresist layer pattern P1 is formed on a predetermined region of the first semiconductor layer 48 that is formed on the lower tunneling layer 46. A region covered by the first photoresist layer pattern P1 is a channel region. An $n^+$-type conductive impurity is then implanted into the first semiconductor layer 48 formed with the first photoresist layer pattern P1 thereon. The first photoresist layer pattern P1 is then removed. Resultantly, the first semiconductor layer 48 is divided into the source and drain regions 48a and 48b doped with the $n^+$-type conductive impurities and the channel region 48c, which was covered by the first photoresist layer pattern P1.

Figure 8:
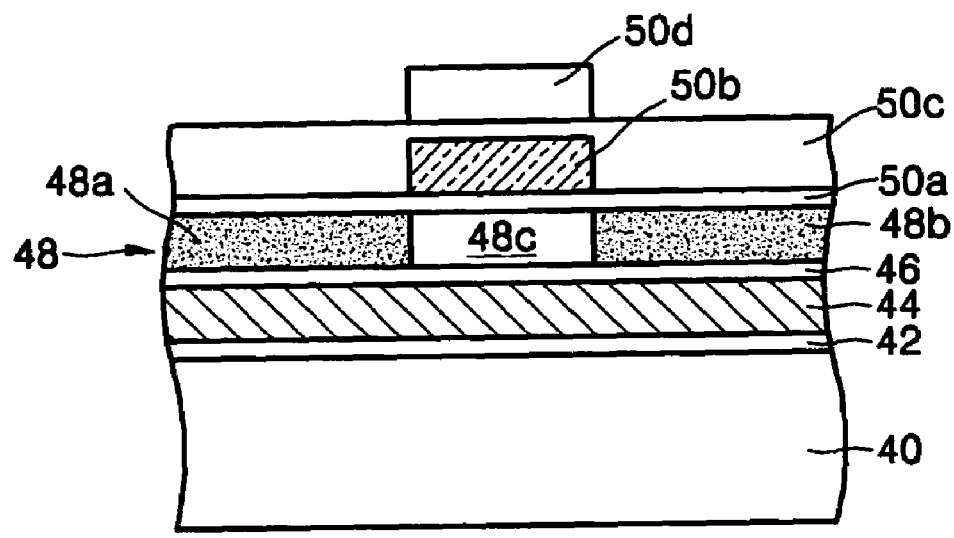

As shown in FIG. 8, the upper tunneling layer 50a that covers the channel region 48c is formed on the first semiconductor layer 48. The upper tunneling layer 50a is formed of a silicon oxide layer. The upper tunneling layer 50a may have a thickness equal to, thinner than or thicker than the lower tunneling layer 46. The upper memory node layer 50b is formed on a predetermined region of the upper tunneling layer 50a, preferably directly above the channel region 48c. The upper memory node layer 50b may be formed of a material layer having a predetermined trap density, e.g., about $10^{12}/cm^2$ or more. Accordingly, the upper memory node layer 50b may be formed of a nitride layer, a PZT layer, or another trap material layer. The upper memory node layer 50b may have a trap density or a thickness that is different from the lower memory node layer 44.

The upper insulating layer 50c that covers the upper memory node layer 50b is formed on the upper tunneling layer 50a. The upper surface of the upper insulating layer 50c is then planarized. The upper insulating layer 50c may be formed of one of an $SiO_2$ layer, an $Al_2O_3$ layer, a $TaO_2$ layer, and a $TiO_2$ layer. The gate electrode 50d is formed on a predetermined region of the upper insulating layer 50c, preferably directly above the upper memory node layer 50b. The gate electrode 50d may be formed of either a semiconductor material doped with conductive impurities or a metal. Subsequently, the upper insulating layer 50c and the upper tunneling layer 50a surrounding the gate electrode 50d are removed, thereby exposing the source and drain regions 48a and 48b of the first semiconductor layer 48, as shown in FIG. 2.

By performing the above-described process, the SONOS memory device shown in FIG. 2 is formed.

Second Embodiment

Figure 9:
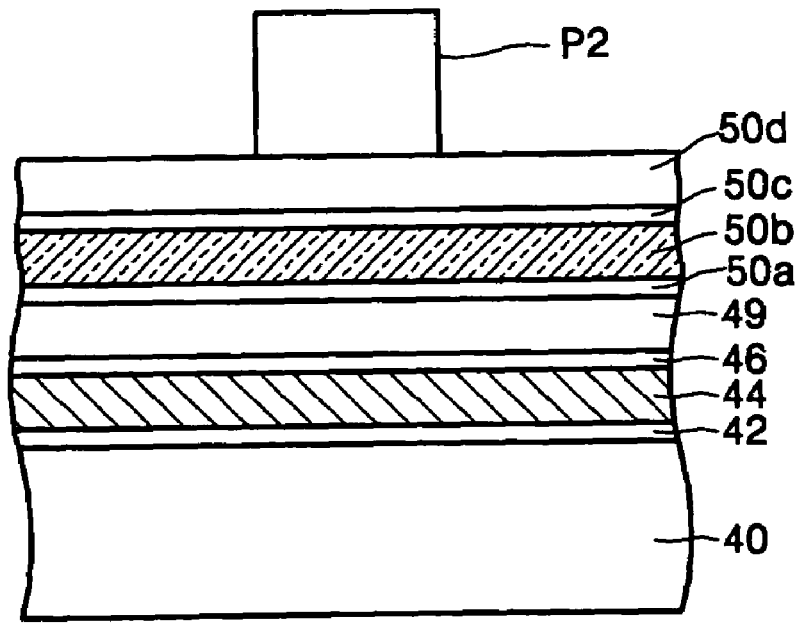
FIGS. 9 and 10 illustrate cross-sectional views of stages in a method of manufacturing the SONOS memory device shown in FIG. 2 according to a second embodiment of the present invention.

Referring to FIG. 9, the lower insulating layer 42, the lower memory node layer 44, and the lower tunneling layer 46 are sequentially formed on the semiconductor substrate 40. Then, a second semiconductor layer 49, i.e., a second memory layer, is formed on the lower tunneling layer 46. The second semiconductor layer 49 may be formed by the same method used to form the first semiconductor layer 48 in connection with the first embodiment, or by a different method. Alternatively, the second semiconductor layer 49 may be formed by stacking silicon Si on the lower tunneling layer 46 instead of bonding.

Figure 10:
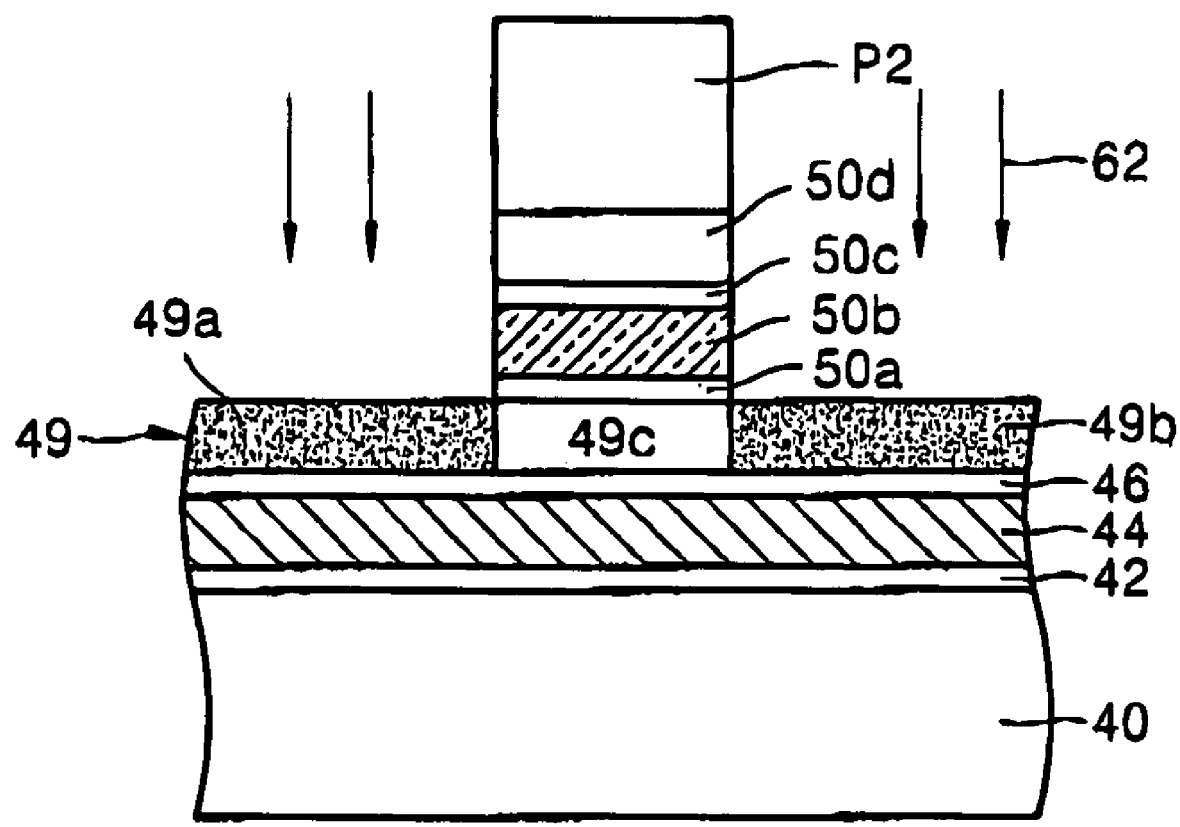

Thereafter, the upper tunneling layer 50a, the upper memory node layer 50b, the upper insulating layer 50c, and the gate electrode 50d are sequentially formed on the second semiconductor layer 49. A second photoresist layer pattern P2 is formed on a predetermined region of the gate electrode 50d. The second photoresist layer pattern P2 defines the channel region on the second semiconductor layer 49, as does the first photoresist layer pattern P1 in connection with the first embodiment. Using the second photoresist layer pattern P2 as an etch mask, the gate electrode 50d, the upper insulating layer 50c, the upper memory node layer 50b, and the upper tunneling layer 50a surrounding the second photoresist layer pattern P2 are sequentially etched, thereby exposing the second semiconductor layer 49, as shown in FIG. 10. The exposed portion of the second semiconductor layer 49 is then doped with a predetermined conductive impurity 62. The second photoresist layer pattern P2 is then removed. Thus, the second semiconductor layer 49 is divided into the channel region 49c covered with the second photoresist layer pattern P2, and the source and drain regions 49a and 49b. Resultantly, a gate stack structure including the upper tunneling layer 50a, the upper memory node layer 50b, the upper insulating layer 50c, and the gate electrode 50d is formed on the channel region 49c of the second semiconductor layer 49.

Now, a method of operating the SONOS memory device according to the embodiment of the present invention shown in FIG. 2 will be described.

<Writing>

A first write voltage is applied between the first semiconductor layer 48 and the semiconductor substrate 40, thereby trapping electrons in the lower memory node layer 44. This state of electrons being trapped in the lower memory node layer 44 is regarded as writing of a first data to the lower SONOS memory. The first data may be "0" or "1".

A second write voltage is then applied between the first semiconductor layer 48 and the gate electrode 50d, thereby trapping electrons in the upper memory node layer 50b. At this time, since the trap densities of the upper memory node layer 50b and the lower memory node layer 44 may be different from each other, the number of electrons trapped in the upper memory node layer 50b may differ from the number of electrons trapped in the lower memory node layer 44. This state of electrons being trapped in the upper memory node layer 50b is regarded as writing of a second data to the upper SONOS memory. The second data may be "0" or "1".

<Reading>

A first predetermined voltage is applied between the source and drain regions 48a and 48b, and the semiconductor substrate 40 is supplied with a first readout voltage. At this time, when a current larger than a predetermined current flows between the source and drain regions 48a and 48b, it is regarded as reading out data "1" from the lower SONOS memory device. Alternatively, when a current smaller than the predetermined current flows between the source and drain regions 48a and 48b, it is regarded as reading out data "0" from the lower SONOS memory device. This reading procedure may be reversed.

In order to read out the data written on the upper SONOS memory device, the source and drain regions 48a and 48b are supplied with a second predetermined voltage, and the gate electrode 50d is supplied with a second readout voltage. Thus, when a current larger than a predetermined current flows between the source and drain regions 48a and 48b, it is regarded as reading out data "1" from the upper SONOS memory device. Alternatively, when a current smaller than the predetermined current flows between the source and drain regions 48a and 48b, it is regarded as reading out data "0" from the upper SONOS memory device. This reading procedure may be reversed.

<Erasing>

In order to erase data written to the lower SONOS memory device, a first erase voltage having a polarity opposite to that of the first write voltage is applied between the first semiconductor layer 48 and the semiconductor substrate 40. When the first erase voltage is applied, the electrons trapped in the lower memory node layer 44 of the lower SONOS memory device are discharged, thereby erasing the recorded data.

In order to erase data written to the upper SONOS memory device, a second erase voltage having a polarity opposite to that of the second write voltage is applied between the first semiconductor layer 48 and the gate electrode 50d. When the second erase voltage is applied, the electrons trapped in the upper memory node layer 50b of the upper SONOS memory device are discharged, thereby erasing the recorded data.

As described above, the SONOS memory device according to an embodiment of the present invention has a common semiconductor layer that includes a channel region, and SONOS memory devices on and under the common semiconductor layer. Therefore, by utilizing the SONOS memory device of the present invention, the packing density can be significantly increased even though typical design rules are applied, because two bits of information are stored in a unit cell. Furthermore, a typical CMOS process can be used without alteration, which facilitates manufacturing.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon-oxide-nitride-oxide-silicon (SONOS) memory device, comprising:
   a semiconductor layer including source and drain regions and a channel region;
   an upper stack structure directly disposed on a first side of the semiconductor layer, the upper stack structure and the semiconductor layer forming an upper SONOS memory device; and
   a lower stack structure directly disposed on a second side of the semiconductor layer, the lower stack structure and the semiconductor layer forming a lower SONOS memory device, wherein:
   the upper stack structure includes an upper tunneling layer, an upper memory node layer, an upper insulating layer, and an upper gate electrode that are sequentially stacked on each other over the channel region of the semiconductor layer,
   the lower stack structure includes a lower tunneling layer, a lower memory node layer, a lower insulating layer, and a lower gate electrode that are sequentially and directly stacked on each other over the channel region of the semiconductor layer, and
   the first side is opposite to the second side of the semiconductor layer.

2. The SONOS memory device as claimed in claim 1, wherein the upper memory node layer is formed of a nitride layer or PZT layer having a predetermined trap density.

3. The SONOS memory device as claimed in claim 2, wherein the predetermined trap density is about $10^{12}/cm^2$ or more.

4. The SONOS memory device as claimed in claim 1, wherein the upper insulating layer is formed of one selected from the group consisting of a silicon oxide ($SiO_2$) layer, an aluminum oxide ($Al_2O_3$) layer, a tantalum oxide ($TaO_2$) layer, and a titanium oxide ($TiO_2$) layer.

5. The SONOS memory device as claimed in claim 1, wherein the upper tunneling layer is formed of a silicon oxide ($SiO_2$) layer.

6. The SONOS memory device as claimed in claim 1, wherein the upper gate electrode is a semiconductor material doped with a conductive impurity or a metal.

7. The SONOS memory device as claimed in claim 1, wherein the upper and lower memory node layers have different thicknesses.

8. The SONOS memory device as claimed in claim 1, wherein the upper and lower memory node layers have different trap densities.

9. The SONOS memory device as claimed in claim 1, wherein the upper and lower memory node layers are formed of different materials.

10. The SONOS memory device as claimed in claim 1, wherein the upper and lower tunneling layers have different thicknesses.

11. The SONOS memory device as claimed in claim 1, wherein the lower memory node layer is formed of a nitride layer or a PZT layer having a predetermined trap density.

12. The SONOS memory device as claimed in claim 11, wherein the predetermined trap density is about $10^{12/cm2}$ or more.

13. The SONOS memory device as claimed in claim 1, wherein the lower insulating layer is formed of one selected from the group consisting of a silicon oxide (SiO$_2$) layer, an aluminum oxide (Al$_2$O$_3$) layer, a tantalum oxide (TaO$_2$) layer, and a titanium oxide (TiO$_2$) layer.

14. The SONOS memory device as claimed in claim 1, wherein the lower tunneling layer is formed of a silicon oxide (SiO$_2$) layer.

15. A method of manufacturing a silicon-oxide-nitride-oxide-silicon (SONOS) memory device, comprising:
    forming a lower stack structure on a first semiconductor substrate, the lower stack structure including a lower insulating layer, a lower memory node layer, and a lower tunneling layer that are directly and sequentially stacked on each other;
    forming a semiconductor layer directly on the lower tunneling layer, the lower stack structure and the semiconductor layer forming a lower SONOS memory device;
    forming an upper stack structure directly on a predetermined region of the semiconductor layer, the upper stack structure including an upper tunneling layer, an upper memory node layer, an upper insulating layer, and an upper gate electrode that are directly and sequentially stacked on each other, and the upper stack structure and the semiconductor layer forming an upper SONOS memory device; and
    forming source and drain regions and a channel region in the semiconductor layer.

16. The method of manufacturing a SONOS memory device as claimed in claim 15, wherein forming the source and drain regions and the channel region in the semiconductor layer is performed before forming the upper stack structure, and forming the source and drain regions and the channel region comprises:
    forming a photoresist layer pattern that defines the channel region on the semiconductor layer;
    implanting a conductive impurity into the semiconductor layer to form the source and drain regions and the channel region in the semiconductor layer; and
    removing the photoresist layer pattern.

17. The method of manufacturing a SONOS memory device as claimed in claim 15, wherein forming the semiconductor layer on the lower tunneling layer comprises:
    forming a hydrogen ion layer within a second semiconductor substrate;
    bonding a surface of the second semiconductor substrate to the lower tunneling layer; and
    removing a portion of the second semiconductor substrate on an opposite side of the hydrogen ion layer as the bonded surface of the second semiconductor substrate.

18. The method of manufacturing a SONOS memory device as claimed in claim 15, wherein, before forming the source and drain regions and the channel region in the semiconductor layer, forming the upper stack structure on the predetermined region of the semiconductor layer comprises:
    sequentially forming the upper tunneling layer, the upper memory node layer, the upper insulating layer, and a material layer for the gate electrode on the semiconductor layer;
    forming a photoresist layer pattern that defines the channel region on the material layer;
    etching the layers stacked on the semiconductor layer in the opposite order to the order in which they were formed, using the photoresist layer pattern defining the channel region as an etch mask; and
    removing the photoresist layer pattern, after forming the source and drain regions and the channel region in the semiconductor layer.

19. The method of manufacturing a SONOS memory device as claimed in claim 18, wherein the upper and lower memory node layers have different thicknesses.

20. The method of manufacturing a SONOS memory device as claimed in claim 18, wherein the upper and lower memory node layers are formed of material layers having different trap densities.

21. The method of manufacturing a SONOS memory device as claimed in claim 18, wherein the upper and lower memory node layers are formed of different material layers.

22. The method of manufacturing a SONOS memory device as claimed in claim 18, wherein the upper insulating layer is formed of one selected from the group consisting of a silicon oxide (SiO$_2$) layer, an aluminum oxide (Al$_2$O$_3$) layer, a tantalum oxide (TaO$_2$) layer, and a titanium oxide (TiO$_2$) layer.

23. The method of manufacturing a SONOS memory device as claimed in claim 18, wherein the upper and lower memory node layers are formed of nitride layers or PZT layers having predetermined trap densities.

24. The method of manufacturing a SONOS memory device as claimed in claim 15, wherein the lower insulating layer is formed of one selected from the group consisting of a silicon oxide (SiO$_2$) layer, an aluminum oxide (Al$_2$O$_3$) layer, a tantalum oxide (TaO$_2$) layer, and a titanium oxide (TiO$_2$) layer.

25. A method of operating a silicon-oxide-nitride-oxide-silicon (SONOS) memory device including a semiconductor layer having source and drain regions and a channel region, an upper stack structure directly disposed on a first side of the semiconductor layer, the upper stack structure including an upper tunneling layer, an upper memory node layer, an upper insulating layer, and an upper gate electrode that are sequentially and directly stacked on each other over the channel region of the semiconductor layer, the upper stack structure and the semiconductor layer forming an upper SONOS memory device, and a lower stack structure directly disposed on a second side of the semiconductor layer, the second side being opposite to the first side, the lower stack structure including a lower tunneling layer, a lower memory node layer, a lower insulating layer, and a lower gate electrode that are sequentially and directly stacked on each other over the channel region of the semiconductor layer, the lower stack structure and the semiconductor layer forming a lower SONOS memory device, the method comprising:
    applying a first write voltage between the semiconductor layer and the lower SONOS memory device to write a first data to the lower SONOS memory device.

26. The method of operating a SONOS memory device as claimed in claim 25, further comprising:
    applying a second write voltage between the semiconductor layer and the upper SONOS memory device to write a second data to the upper SONOS memory device, after writing the first data to the lower SONOS memory device.

27. A method of operating a silicon-oxide-nitride-oxide-silicon (SONOS) memory device including a semiconductor layer having source and drain regions and a channel region, an upper stack structure directly disposed on a first side of the semiconductor layer, the upper stack structure including an upper tunneling layer, an upper memory node layer, an upper insulating layer, and an upper gate electrode that are sequentially and directly stacked on each other over the channel region of the semiconductor layer, the upper stack structure and the semiconductor layer forming an upper SONOS memory device, and a lower stack structure directly disposed on a second side of the semiconductor layer, the second side being opposite to the first side, the lower stack structure including a lower tunneling layer, a lower memory node layer, a lower insulating layer, and a lower gate electrode that are sequentially and directly stacked on each other over the channel region of the semiconductor layer, the lower stack structure and the semiconductor layer forming a lower SONOS memory device, the method comprising:

applying a read voltage to either the upper or lower SONOS memory device while maintaining a potential difference between the source and drain regions to read out data stored in the upper or lower SONOS memory devices, respectively.

28. A method of operating a silicon-oxide-nitride-oxide-silicon (SONOS) memory device including a semiconductor layer having source and drain regions and a channel region, an upper stack structure directly disposed on a first side of the semiconductor layer, the upper stack structure including an upper tunneling layer, an upper memory node layer, an upper insulating layer, and an upper gate electrode that are sequentially and directly stacked on each other over the channel region of the semiconductor layer, the upper stack structure and the semiconductor layer forming an upper SONOS memory device, and a lower stack structure directly disposed on a second side of the semiconductor layer, the second side being opposite to the first side, the lower stack structure including a lower tunneling layer, a lower memory node layer, a lower insulating layer, and a lower gate electrode that are sequentially and directly stacked on each other over the channel region of the semiconductor layer, the lower stack structure and the semiconductor layer forming a lower SONOS memory device, the method comprising:

applying a first erase voltage between the semiconductor layer and the upper SONOS memory device to erase data written to the upper SONOS memory device.

29. The method of operating a SONOS memory device as claimed in claim 28, wherein the first erase voltage has a polarity opposite to a polarity of a first write voltage used to write data to the upper SONOS memory device.

30. The method of operating a SONOS memory device as claimed in claim 28, further comprising:

applying a second erase voltage between the semiconductor layer and the lower SONOS memory device to erase data written to the lower SONOS memory device.

31. The method of operating a SONOS memory device as claimed in claim 30, wherein the second erase voltage has a polarity opposite to a polarity of a second write voltage used to write data to the lower SONOS memory device.

* * * * *